(12) United States Patent
Vishne et al.

(10) Patent No.: US 8,190,972 B2
(45) Date of Patent: May 29, 2012

(54) ERROR CHECKING AND CORRECTION OVERLAP RANGES

(75) Inventors: Nahum N. Vishne, Elad (IL); Alex Shinkar, Rishon-Lezion (IL)

(73) Assignee: LSI Corporation, Milpitas, CA (US)

( * ) Notice: Subject to any disclaimer, the term of this patent is extended or adjusted under 35 U.S.C. 154(b) by 926 days.

(21) Appl. No.: 12/210,470

(22) Filed: Sep. 15, 2008

(65) Prior Publication Data

US 2010/0070829 A1    Mar. 18, 2010

(51) Int. Cl.
*G11C 29/00* (2006.01)
(52) U.S. Cl. ..................................................... 714/763
(58) Field of Classification Search .............. 714/758, 714/763
See application file for complete search history.

(56) References Cited

U.S. PATENT DOCUMENTS

| | | | | |
|---|---|---|---|---|
| 4,866,717 A | * | 9/1989 | Murai et al. | 714/765 |
| 5,687,183 A | * | 11/1997 | Chesley | 714/774 |
| 6,662,333 B1 | * | 12/2003 | Zhang et al. | 714/767 |
| 2008/0082892 A1 | * | 4/2008 | Kushida | 714/758 |

OTHER PUBLICATIONS

"DW_ecc Error Checking and Correction", Synopsys, Inc., Mar. 2007, pp. 1-10.

* cited by examiner

*Primary Examiner* — Guy Lamarre
(74) *Attorney, Agent, or Firm* — Christopher P. Maiorana, PC

(57) ABSTRACT

A method to write data with error checking and correction overlap ranges is disclosed. The method generally includes the steps of (A) receiving plurality of input numbers in a plurality of input signals, (B) generating a plurality of error correction codes by separately operating on each of a plurality of unique pairs of the input numbers, wherein each of the error correction codes is configured to correct at least one error in a corresponding one of the unique pairs and (C) storing the input numbers and the error correction codes in a memory.

20 Claims, 7 Drawing Sheets

ERROR CHECKING AND CORRECTION OVERLAP RANGES

FIELD OF THE INVENTION

The present invention relates to error correction codes generally and, more particularly, to a method and/or apparatus for implementing error checking and correction overlap ranges.

BACKGROUND OF THE INVENTION

Memory chips are small, sensitive and consume small amounts of electrical power to perform on/off switching functions in individual bit cells. Bit cell switching and state retention operations can be disrupted by particles from outer space passing through the memory at the speed of light. Error checking and correction is technology that allows computers to correct memory errors. A popular type of error checking and correction commonly used in memory modules is single bit error correction, often referred to as check bits or error correction codes (ECC). The check bits enables detection and correction of single-bit errors. The check bits also enables detection of two-bit and some multiple bit errors, but is unable to correct such multi-bit errors.

For each data item sent across the memory bus, check bits are generated according to a correction technique. The check bits are then stored in the memory with the original data. The system uses the check bits to determine if the data is correct, and if not, locate and correct the single-bit error. The check bits are transferred with the original data. Therefore, an error checking and correction memory is wider then the non-error checking and correction memory. The number of check bits depends on a size of the data for correction. Table I illustrates the number of check bits as a function of the number of original data bits.

TABLE I

| Original data width (bits) | Number of check bits | Number of check bits per data bits |
|---|---|---|
| X | Y(X) = log(X) + 2 | X/Y(X) |
| 8 | 5 | 0.625 |
| 16 | 6 | 0.375 |
| 32 | 7 | 0.21875 |
| 64 | 8 | 0.125 |
| 128 | 9 | 0.0703125 |

As shown in the table, as the number data bits increases, the number of check bits increases while the ratio of check bits per data bits decreases.

Referring to FIG. 1, a functional block diagram 10 of a convention memory write using check bits is shown. A conventional memory 12 is enlarged to store both the data bits 14 and an appropriate number of check bits 16 according to a data size that should be protected from errors. For example, if an error rate demands protecting the data from 1 bit error in every 8 bits (1 byte), error checking and correction processes 18a-18d operate on each byte of write data (i.e., 32 bits total). In the example, 5 check bits are added to every 8 bits of write data prior to storage in the memory 12.

Referring to FIG. 2, a functional block diagram 20 of a convention memory read using check bits is shown. Both the original data and the associated check bits are read from the memory 12 and presented to the error checking and correction processes 18a-18d. The error checking and correction processes 18a-18d determine if any errors are present in the received byte, and if so, correct the errors. A disadvantage of the conventional reads 20 and writes 10 is that a relatively large amount of the memory 12 is consumed by the check bits.

SUMMARY OF THE INVENTION

The present invention concerns a method to write data with error checking and correction overlap ranges. The method generally includes the steps of (A) receiving plurality of input numbers in a plurality of input signals, (B) generating a plurality of error correction codes by separately operating on each of a plurality of unique pairs of the input numbers, wherein each of the error correction codes is configured to correct at least one error in a corresponding one of the unique pairs and (C) storing the input numbers and the error correction codes in a memory.

The objects, features and advantages of the present invention include providing a method and/or apparatus for implementing error checking and correction overlap ranges that may (i) reduce redundancy bits by using overlap regions, (ii) reduce memory consumption compared with conventional techniques by reducing the total number of check bits in use, (iii) provide error coding delays similar to conventional coding delays and/or (iv) provide error detection and correction delays proximate to conventional error detection and correction delays.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

When reading or writing several data items at a time to and from a memory, error checking and correction may be made more efficient by using fewer error correction codes (ECCs) to protect wider ranges of the data items. In some embodiments, four ECC ranges each of a size X may be replaced by three ECC ranges each of a size 2×. For example, instead of protecting four 8-bit data items with four respective 5-bit error correction codes, two 16-bit data items may be protected with three 6-bit error correction codes. Table II generally illustrates the number of error correction codes as a function of the number of original data bits.

TABLE II

| Original data width (bits) | Number of ECC bits | Number of ECC bits per data bit | Number of ECC bits of four data blocks | Number of ECC bits of three double-data blocks |
|---|---|---|---|---|
| X | Y(X) = log(X) + 2 | X/Y(X) | 4 * Y(X) | 3 * Y(2X) |
| 8 | 5 | 0.625 | 20 | 18 |
| 16 | 6 | 0.375 | 24 | 21 |
| 32 | 7 | 0.21875 | 28 | 24 |
| 64 | 8 | 0.125 | 32 | 27 |
| 128 | 9 | 0.0703125 | 36 | 30 |

For all of the illustrated data widths, the number of ECC bits is generally reduced compared with the common approaches. Furthermore, the error detection and correction capabilities are generally maintained similar to the common approaches since the ECC ranges are overlapping.

Figure 1:
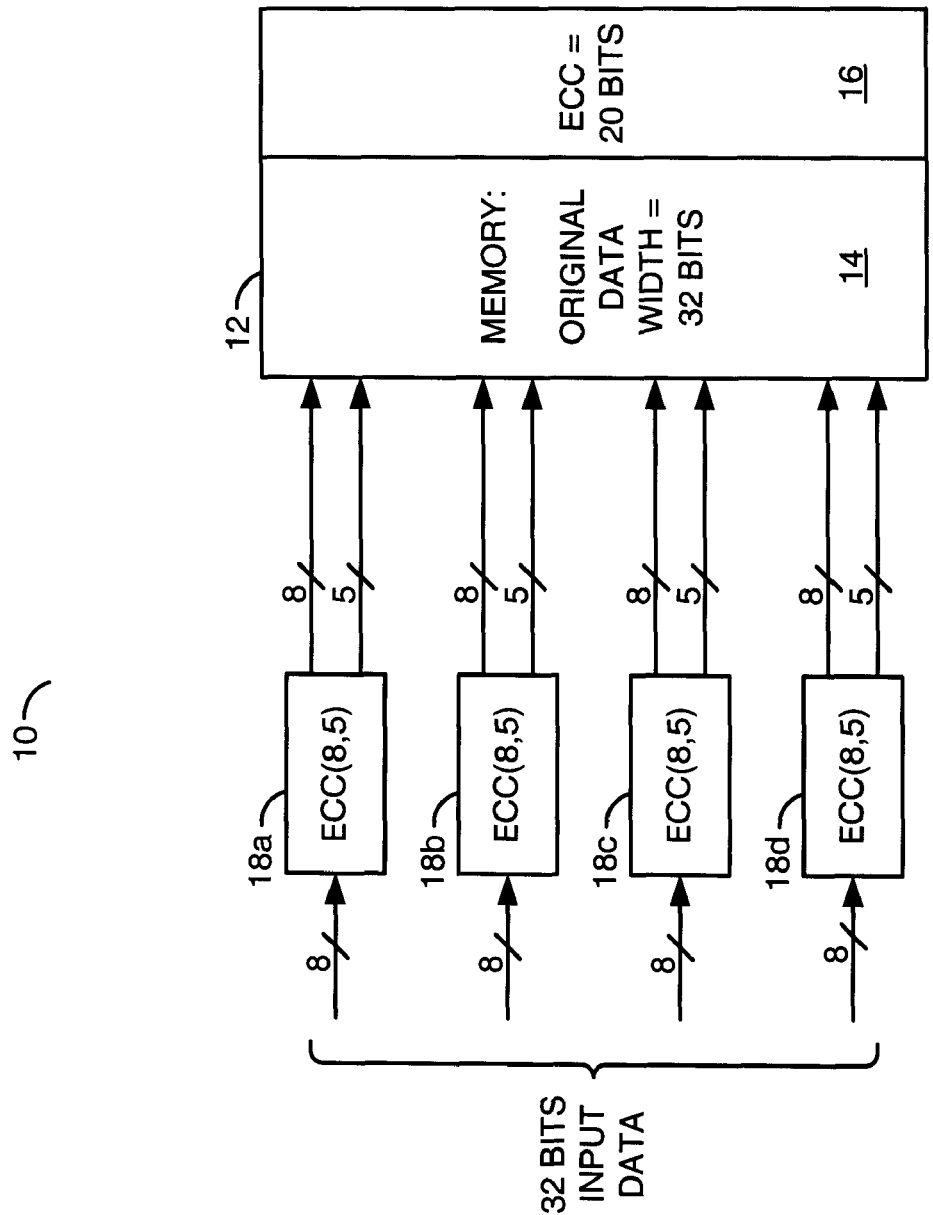
FIG. 1 is a functional block diagram of a convention memory write using check bits.
Figure 2:
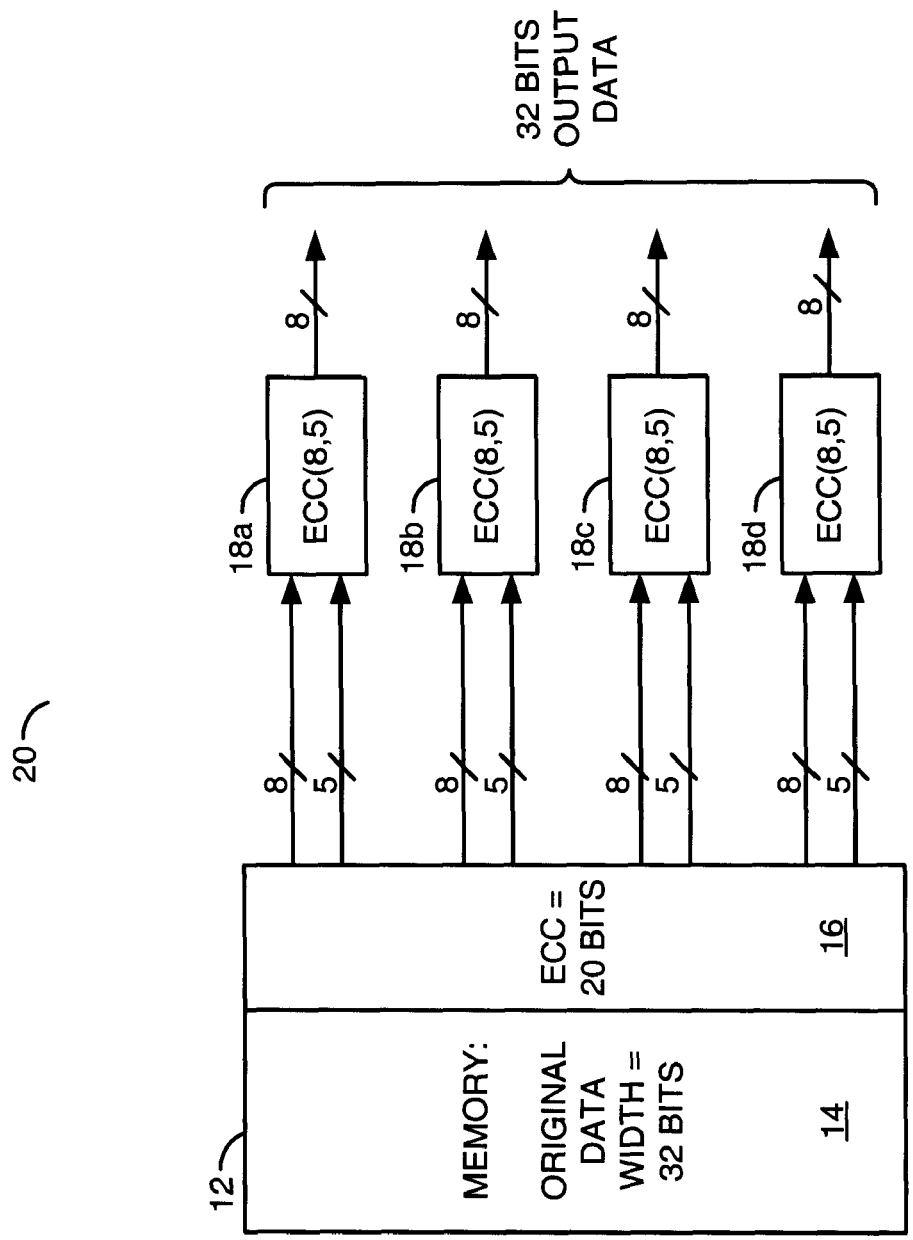
FIG. 2 is a functional block diagram of a convention memory read using check bits.
Figure 3:
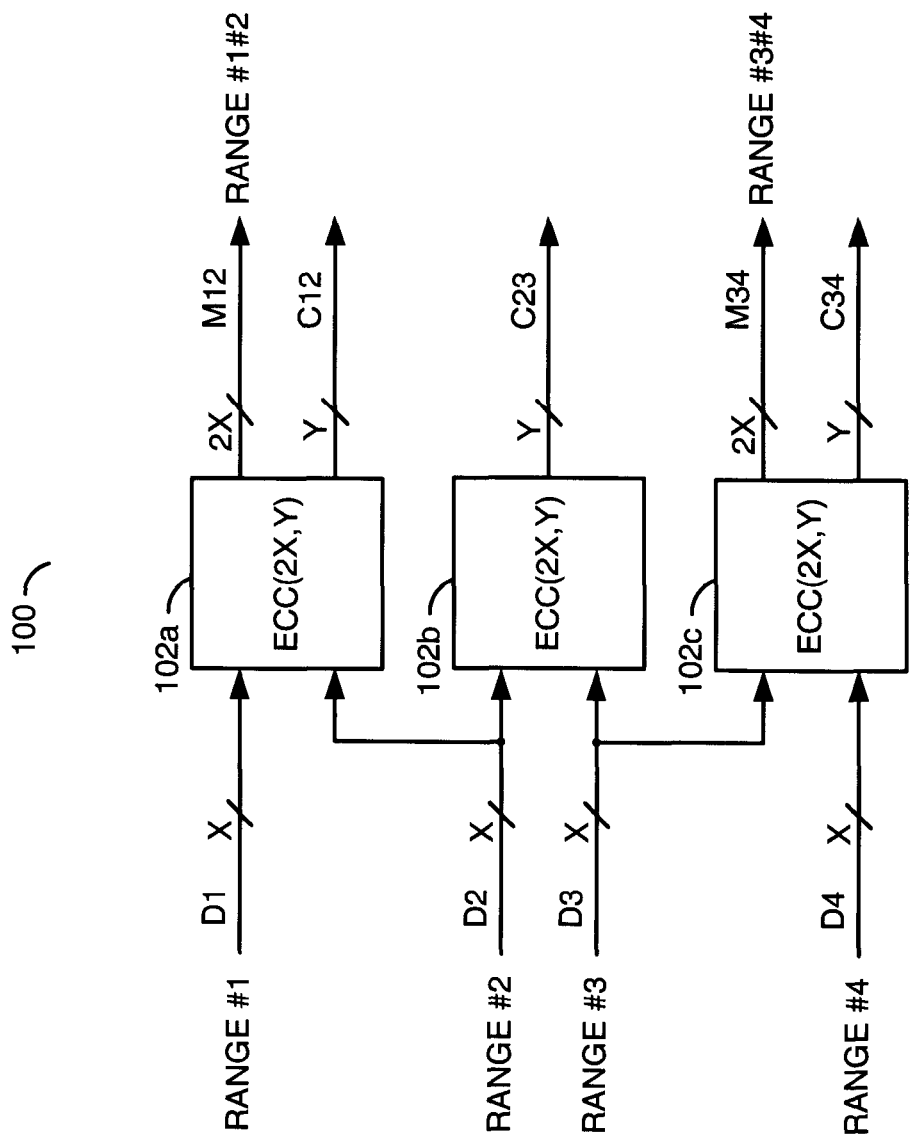
FIG. 3 is a functional block diagram of an example apparatus implementing error checking and correction overlapping ranges for a memory write in accordance with a preferred embodiment of the present invention.

Referring to FIG. 3, a functional block diagram of an example apparatus 100 implementing ECC overlapping ranges for a memory write is shown in accordance with a preferred embodiment of the present invention. The apparatus (or unit) 100 generally comprises multiple circuits (or modules) 102a-102c.

A data signal (e.g., D1) may be received by the circuit 102a. A data signal (e.g., D2) may be received by the circuit 102a and the circuit 102b. A data signal (e.g., D3) may be received by the circuit 102b and the circuit 102c. The circuit 102c may also receive a data signal (e.g., D3). The circuit 102a may generate and present a data signal (e.g., M12) and an ECC signal (e.g., C12). The circuit 102b may generate and present an ECC signal (e.g., C23). The circuit 102c may generate and present a data signal (e.g., M34) and an ECC signal (e.g., C34).

Each of the signals D1, D2, D3 and D4 may convey a multi-bit (e.g., X-bit) binary number. The binary numbers may each represent $2^x$ unique values. Pairs of the adjoining signals D1, D2, D3 and D4 may be appended together to form three larger signals. For example, the signals D1 and D2 may be appended together to create a first combined signal of 2X bits. The signals D2 and D3 may be appended to create a second combined signal of 2X bits. The signals D3 and D4 may be appended to create a third combined signal of 2X bits. The binary number established by the combined signals generally represents $2^{2X}$ unique values.

Each combined signal is generally received at a respective circuit 102a-102c. The circuits 102a-102c may be implemented as error coding circuits. The circuits 102a-102c may be operational to perform an error coding of the received combined signals. In some embodiments, the circuits 102a-102c may also be operational to perform error checking and correction.

The error coding generally creates the signals C12, C23 and C34, one signal for each respective one of the combined signals. Each of the signals C12, C23 and C34 may have Y-bits. A relationship between the Y-bits and the 2X-bits of the combined input data is generally expressed equation 1 as follows:

$$Y(X) = \log(2X) + 2 \qquad \text{Eq. (1)}$$

An example implementation of the circuits 102a-102c is generally disclosed in a datasheet "DW_ecc", release DWF_0206, March 2007, published by Synopsys, Inc., Mountain View, Calif. The DW_ecc datasheet is hereby incorporated by reference in its entirety. Other designs of the circuits 102a-102c may be implemented to meet the criteria of a particular application.

In general, every four ECC ranges (e.g., range #1, range #2, range #3, range #4) may be checked by the three ECC circuits 102a-102c instead of four ECC circuits. The use of fewer ECC circuits generally reduces the number of redundant bits generated by the error coding process and thus reduces a correction level. For example, the error correction code generated in the signal C12 by the circuit 102a may correct a single bit in the double-range value (e.g., range #1#2) carried by the signal M12. Likewise, the error correction code generated in the signal C34 by the circuit 102c may correct a single bit in the double-range value (e.g., range #3#4) carried by the signal M34. Therefore, the ECC circuit 102b may be included in the apparatus 100 to generate an error correction code for the double-range value (e.g., range #2#3) created by the combination of the signals D2 and D3. If no multiple errors exist in the range #2 and the range #3, the corrected data created by the circuit 102b may be used by the other two circuits 102a and 102c on a read. As such, a single error in the combined range #2#3 may be fixed before checking (i) the combined range #1#2 and (ii) the combined range #3#4 for other errors.

The resulting structure generally enables correction of (i) a single error in a single range and (ii) two errors in two ranges. Multiple errors in one range are generally uncorrectable, but may be detected as in the existing solutions. In a few specific cases, the above approach may not correct three errors in three ranges. However, the probability of such cases is generally much less than seeing two errors in one range, which also cannot be corrected by the existing solution.

The specific cases generally have a low probability of occurrence. Consider a probability (e.g., 1/p) of a single error in one range. The probability of two errors in one range is generally $1/p^2$ and probability of three errors in three ranges may be $8/p^3$. Since p>>8, the probability of three errors in three ranges may be considered negligible.

Figure 4:
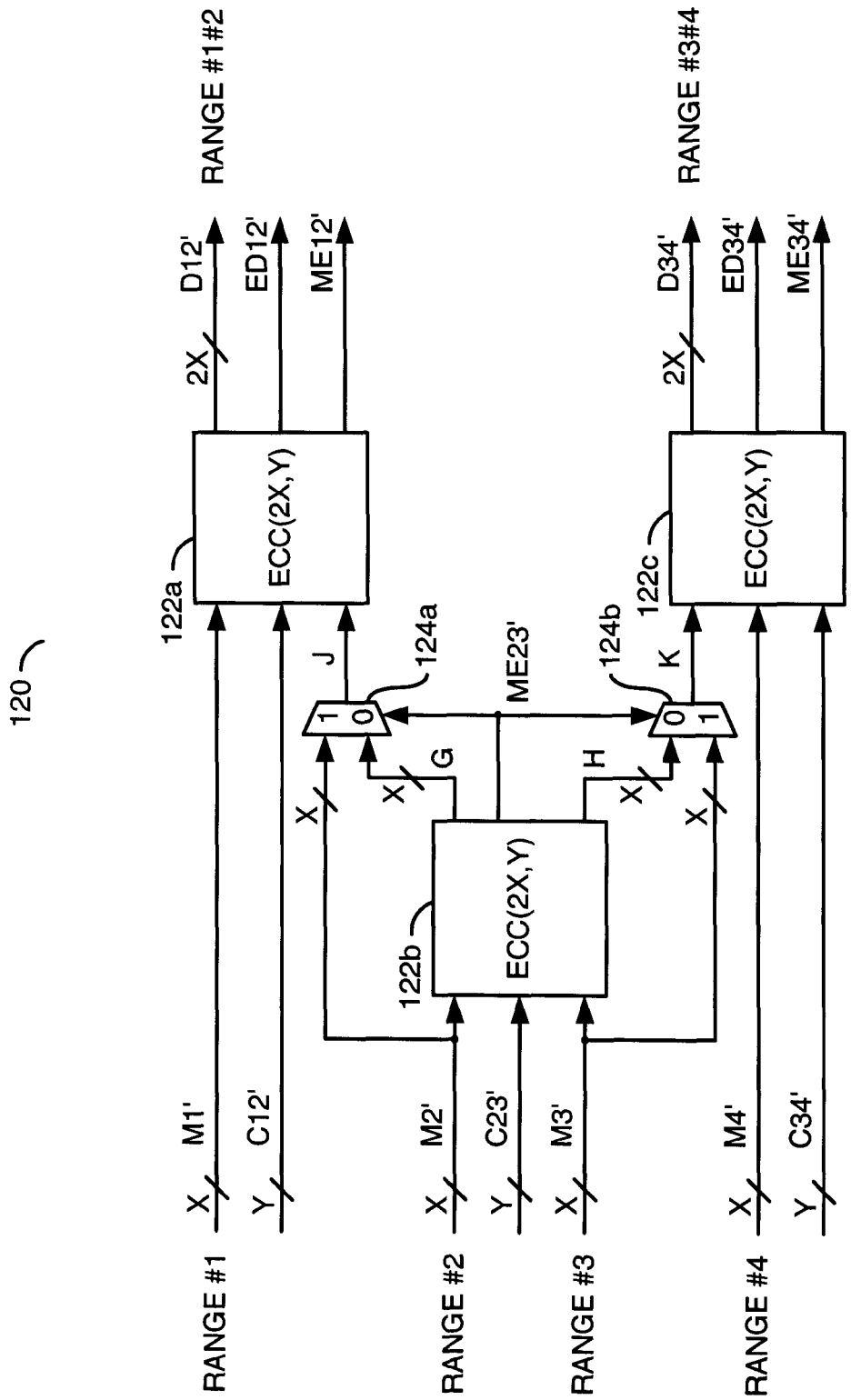
FIG. 4 is a functional block diagram of an example apparatus implementing error checking and correction overlapping ranges for a memory read.

Referring to FIG. 4, a functional block diagram of an example apparatus 120 implementing ECC overlapping ranges for a memory read is shown. The apparatus (or unit) 120 generally comprises multiple circuits (or modules) 122a-122c and multiple circuits (or modules) 124a-124b. The circuit 122a may receive a signal (e.g., M1'), a signal (e.g., C12') and an intermediate signal (e.g., J). The circuit 122b may receive a signal (e.g., M2'), a signal (e.g., C23') and a signal (e.g., M3'). The circuit 122c may receive an intermediate signal (e.g., K), a signal (e.g., C34') and a signal (e.g., M4'). A signal (e.g., D12') may be generated by the circuit 122a. A signal (e.g., G) may be generated by the circuit 122b and presented to the circuit 124a. A signal (e.g., H) may also be generated by the circuit 122b and presented to the circuit 124b. A signal (e.g., D34') may be generated by the circuit 122c. The circuit 124a may receive the signals G and M2'. The signal J may be generated by the circuit 124a. The circuit 124b may receive the signals H and M3'. The signal K may be generated by the circuit 124b. A multi-error signal (e.g., ME23') may be generated by the circuit 122b and presented to each of the circuits 124a-124b. Another multi-error signal (e.g., ME12') may be generated by the circuit 122a. A multi-error signal (e.g., ME34') may be generated by the circuit 122c. An error-detected signal (e.g., ED12') may be generated by the circuit 122a. Another error-detected signal (e.g., ED34') may be generated by the circuit 122c.

The circuits 122a-122c may be implemented as error checking and correction circuits. The circuits 122a-122c may be operational to check for errors among values received in inputs signals and correct at least one bit-error when discovered. In some embodiments, the circuits 122a-122c may also be operational to perform error coding functions (e.g., same as the circuits 102a-102c). An example implementation of the circuits 122a-122c may be according to the datasheet "DW_ecc". Other designs of the error detection and correction functions may be implemented to meet the criteria of a particular application.

The circuits 124a-124b may be implemented as multiplexers. The circuit 124a may be operational to multiplex the signal M2' and the signal G into the signal J, as controlled by the signal ME23'. The circuit 124b may be operational to multiplex the signal M3' and the signal H into the signal K, as controlled by the signal ME23'.

If no errors have occurred during the storage and/or transmission of the signals M12, M34, C12, C23 and C34, the values within the signals M12, M34, C12, C23 and C34 will generally match the respective values in the signals M12', M34', C12', C23' and C34'. If one or more errors are created during the storage and/or transmission of the signals M12, M34, C12, C23 and C34, the values within the corresponding signals M12', M34', C12', C23' and C34' may be different.

The signal G generally carries a corrected value or an original error-free value of the signal M2'. The signal H generally carries a corrected value or an original error-free value of the signal M3'. The signal ME23' may be asserted (e.g., a logical one state) to indicate an uncorrectable mode where one or more uncorrectable errors (e.g., multi-bit errors) are detected among the signals M2', M3' and C23'. The uncorrectable errors may be in any one of the signals M2', M3' and C23' or distributed among two signals or all three of the signals M2', M3' and C23'. The signal ME23' may be deasserted (e.g., a logical zero state) to indicate a correctable mode where only correctable errors (e.g., no errors or a single bit error) are detected among the signals M2', M3' and C12'. As such, the signal ME23' may be referred to as a mode signal.

The circuit 122b may receive the signals M2' and M3' as a double-range appended signal. The signals M2' and M3' may convey values of range #2 and range #3 to the circuit 122b. If no errors are detected, the circuit 122b may pass the values of range #2 and range #3 through to the signals G and H (e.g., G=M2' and H=M3'). With the signal ME23' deasserted (e.g., second mode), the circuits 124a and 124b may pass the values within the signals G and H through to the signals J and K respectively. If correctable errors are detected, the circuit 122b may correct the errors and present the corrected values in the signals G and H. Since the signal ME23' may remain deasserted (e.g., correctable mode) because all errors were corrected, the corrected values in the signals G and H may be routed by the circuits 124a and 124b into the signals J and K respectively.

If one or more non-correctable errors are discovered among the signals M2', M3' and C23', the circuit 122b may assert the signal ME23' (e.g., uncorrectable mode). Because the circuit 122b has detected uncorrectable errors, the values presented in one or both of the signals G and H may be corrupted. As such, the asserted signal ME23' may cause the circuits 124a and 124b to route the original signals M2' and M3' through to the signals J and K respectively. If the signal M2' is error free or contains only correctable errors (e.g., all of the uncorrectable errors are in the signal M3'), passing the signal M2' through the circuit 124a may enable the circuit 122a to recover the original data items in the signals M1' and M2'. Likewise, if the signal M3' is error free or contains only correctable errors (e.g., all of the uncorrectable errors are in the signal M2'), passing the signal M3' through the circuit 124b may enable the circuit 122c to recover the original data items in the signals M3' and M4'. In some embodiments where the circuit 122b is guaranteed not to corrupt the signals G and H in the presence of uncorrectable errors, the circuits 124a and 124b may be eliminated.

The circuit 122a is generally operational to perform error detection and correction of the values received in the signals M1', C12' and J. The values in the signals M1' and J may be appended to create a double-range input to the circuit 122a. The corrected double-range values or the original error-free values in the signal D12' may be parsed at an output of the circuit 122a to recreate the two original single-range values.

The signals ME12' and ED12' may be asserted (e.g., the logical one state) to indicate the uncorrectable mode where one or more uncorrectable errors (e.g., multi-bit errors) are detected among the signals M1', C12' and J. The uncorrectable errors may be in any one of the signals M1', C12' and J or distributed among two signals or all three of the signals M1', C12' and J. The signal ME12' may be deasserted (e.g., the logical zero state) to indicate the correctable mode where only correctable errors (e.g., no errors or a single bit error) are detected among the signals M1', C12' and J. The signal ED12' may be asserted where correctable errors are detected and deasserted where no errors are detected.

The circuit 122c is generally operational to perform error detection and correction of the values received in the signals M4', C34' and K. The values in the signals M4' and K may be appended to create a double-range input to the circuit 122c. The corrected double-range values or the original error-free values in the signal D34' may be parsed at an output of the circuit 122c to recreate the two original single-range values.

The signals ME34' and ED34' may be asserted (e.g., the logical one state) to indicate the uncorrectable mode where one or more uncorrectable errors (e.g., multi-bit errors) are detected among the signals M4', C34' and K. The uncorrectable errors may be in any one of the signals M4', C34' and K or distributed among two signals or all three of the signals M4', C34' and K. The signal ME34' may be deasserted (e.g., the logical zero state) to indicate the correctable mode where only correctable errors (e.g., no errors or a single bit error) are detected among the signals M4', C34' and K. The signal ED34' may be asserted where correctable errors are detected and deasserted where no errors are detected.

Figure 5:
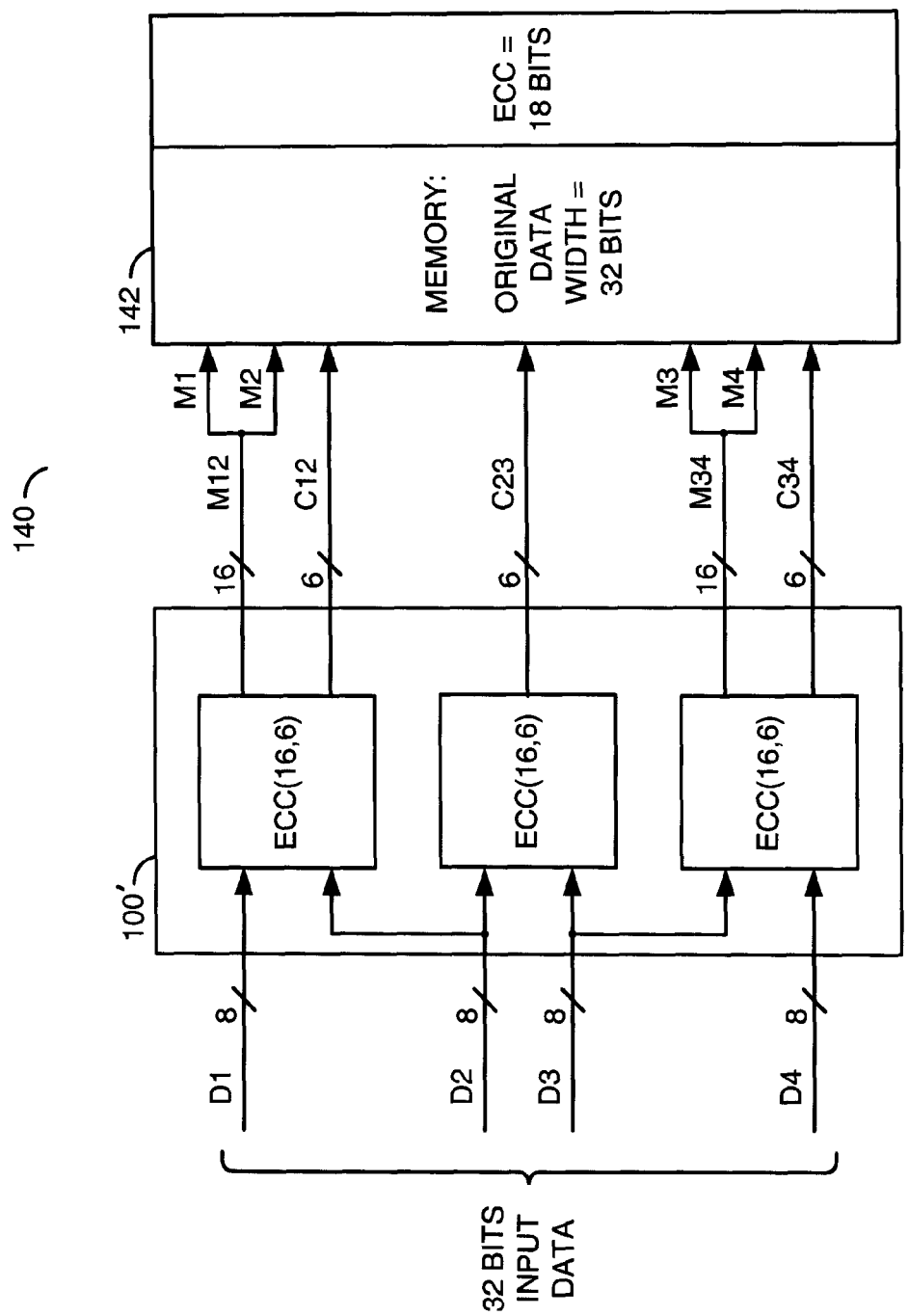
FIG. 5 is a functional block diagram of an example implementation of a write system.

Referring to FIG. 5, a functional block diagram of an example implementation of a write system 140 is shown. The system (or device) 140 generally comprises an apparatus (or unit) 100' and a circuit (or module) 142. The signals D1, D2, D3 and D4 may be received by the apparatus 100' from other parts of the system 140. The signals M12, C12, C23, M34 and C34 may be generated by the apparatus 100' and presented to the circuit 142. The apparatus 100' may be a specific embodiment of the apparatus 100 configured to operate at a specific data width. The circuit 142 may be implemented as a memory.

Consider a specified error rate that may protect data in the circuit 142 from a single bit error in every eight bits (1 byte). The specified protection may be achieved by using two 6-bit ECC values to protect the two 16-bit combined data items and another 6-bit ECC value to increase the overall error detection and correction capability. Therefore, the above technique generally results in adding an average of 4.5 bits for every 8 bits of data.

Each of the single-range signals D1, D2, D3 and D4 may convey an 8-bit value. Each of the double-range signals M12 and M34 may convey a 16-bit value. Each of the signals C12, C23 and C34 may convey a 6-bit value.

The apparatus 100' generally performs multiple (e.g., three) parallel error coding operations on multiple (e.g., three) double-range appended inputs. The original data items may be presented by the apparatus 100' in pairs within the signals M12 and M34 (e.g., M12=M1 appended to M2, M34=M3 appended to M4). The ECC signals C12, C23 and C34 may be created to provide error detection of one or more bit-errors and correction of at least one bit-error per the 16-bit combined inputs.

The circuit 142 may be configured to store the values received in the signals M12, C12, C23, M34 and C34. The circuit 142 may be sized to the store 32-bit data values and the 18-bit ECC values. By comparison, a common approach to error coding the four 8-bits input values would generate 20 ECC bits (see TABLE I). As such, the technique of some embodiments of the present invention may save an appreciable amount of storage capacity of the circuit 142.

Figure 6:
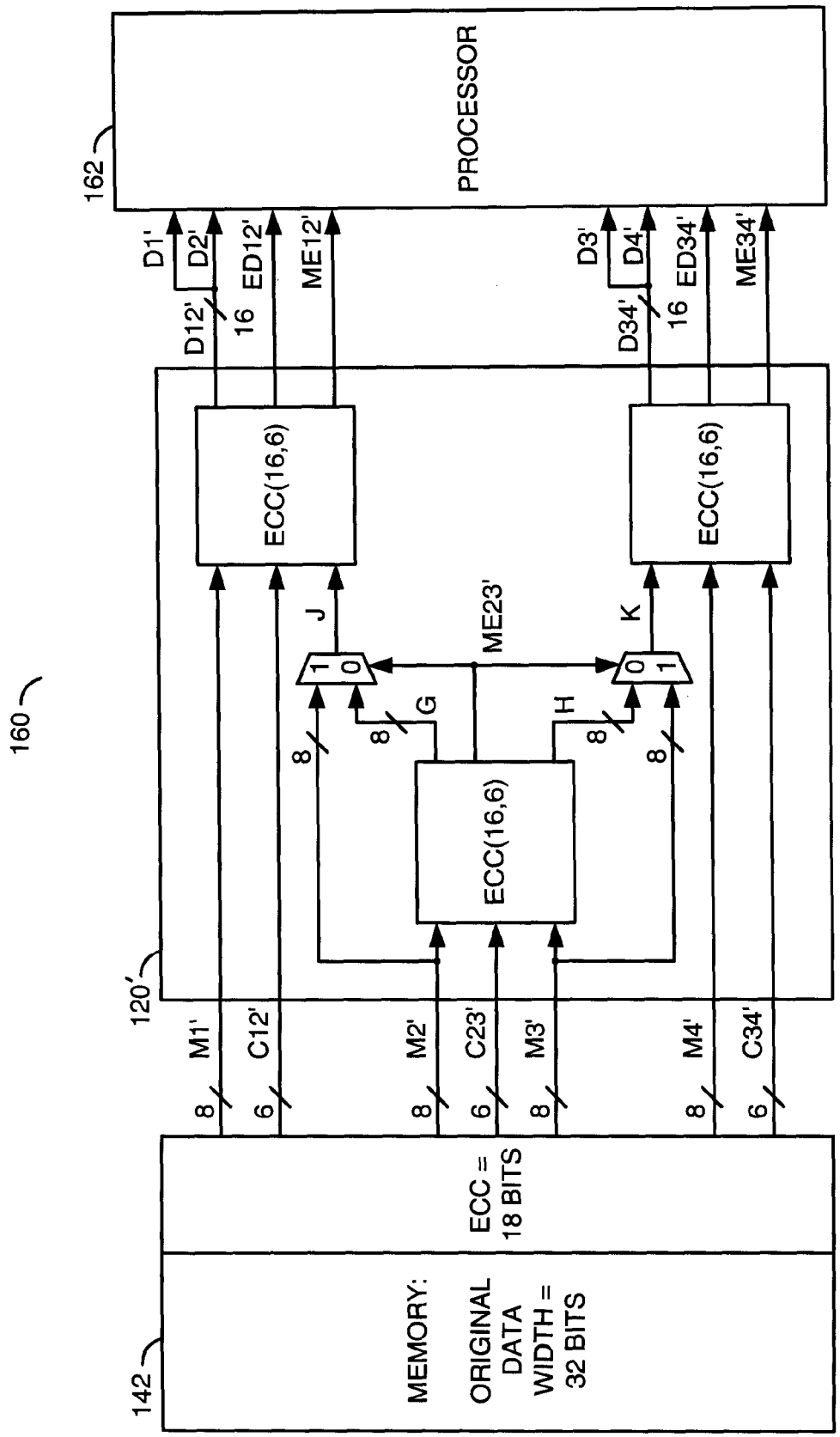
FIG. 6 is a functional block diagram of an example implementation of a read system.

Referring to FIG. 6, a functional block diagram of an example implementation of a read system 160 is shown. The system (or device) 160 generally comprises an apparatus (or unit) 120', the circuit 142 and a circuit (or module) 162. The signals M1', M2', M3' and M4' may be received by the apparatus 120' from the circuit 142. The signals D12', D341, ED12' ED34', ME12' and ME34' may be generated by the apparatus 120' and presented to the circuit 162 and/or other parts of the system 160. The apparatus 120' may be a specific embodiment of the apparatus 120 configured to operate at a specific data width.

Each of the single-range signals M1', M2', M3' and M4' may convey an 8-bit value. Each of the signals D12' and D34' may convey an 16-bit value, where (i) D12' parsed becomes D1' and D2' and (ii) D34' parsed becomes D3' and D4'. Each of the signals D1', D2', D3' and D4' may carry an 8-bit value. Each of the signals C12', C23' and C34' may convey a 6-bit value.

The apparatus 120' generally performs multiple (e.g., three) error checking and correction operations on multiple (e.g., three) double-range appended inputs based on the ECC signals C12', C23' and C34'. The data items processed by the error checking and correction operations may be presented by the apparatus 120' within the signals D1', D2', D3' and D4' to the circuit 162.

In some embodiments, the circuit 162 may be implemented as a processor that consumes the data items in the signals D1', D2', D3' and D4'. The circuit 162 may also inspect the signals ED12', ED34', ME12' and ME34' to determine the validity of the data items within the signals D1', D2', D3' and D4'. In other embodiments, the circuit 162 may be implemented as other circuits, such as an encoding circuit, a transmission circuit, a storage circuit or the like.

The above example using the ECC structure may save approximately 6.25% of the memory capacity of the circuit 142 normally reserved for ECC data. For example, in a memory of 256 kilobytes, the above techniques may save approximately 128 kilobits. In general, an access size to the circuit 142 may be at least four times wider than the ECC-data width. As such, at least four data items may be written into the circuit 142 at a time. Likewise, at least four data items may be read from the circuit 142 at a time. To write individual portions (e.g., bytes) of the data into the circuit 142, a read-modify-write cycle may be used to obtain the neighboring portions. To read individual portions, a read cycle may be used to obtain a particular portion and the associated neighbors. The associated neighbors may then be ignored.

In some implementations, the delay caused by the sequential delays through the circuit 122b first and then the circuits 122a and 122c second may create a timing issue. To speed up the timing, the data items may be presented from the circuit 142 directly to the circuit 162 while the error checking and correction are performed in the background.

Figure 7:
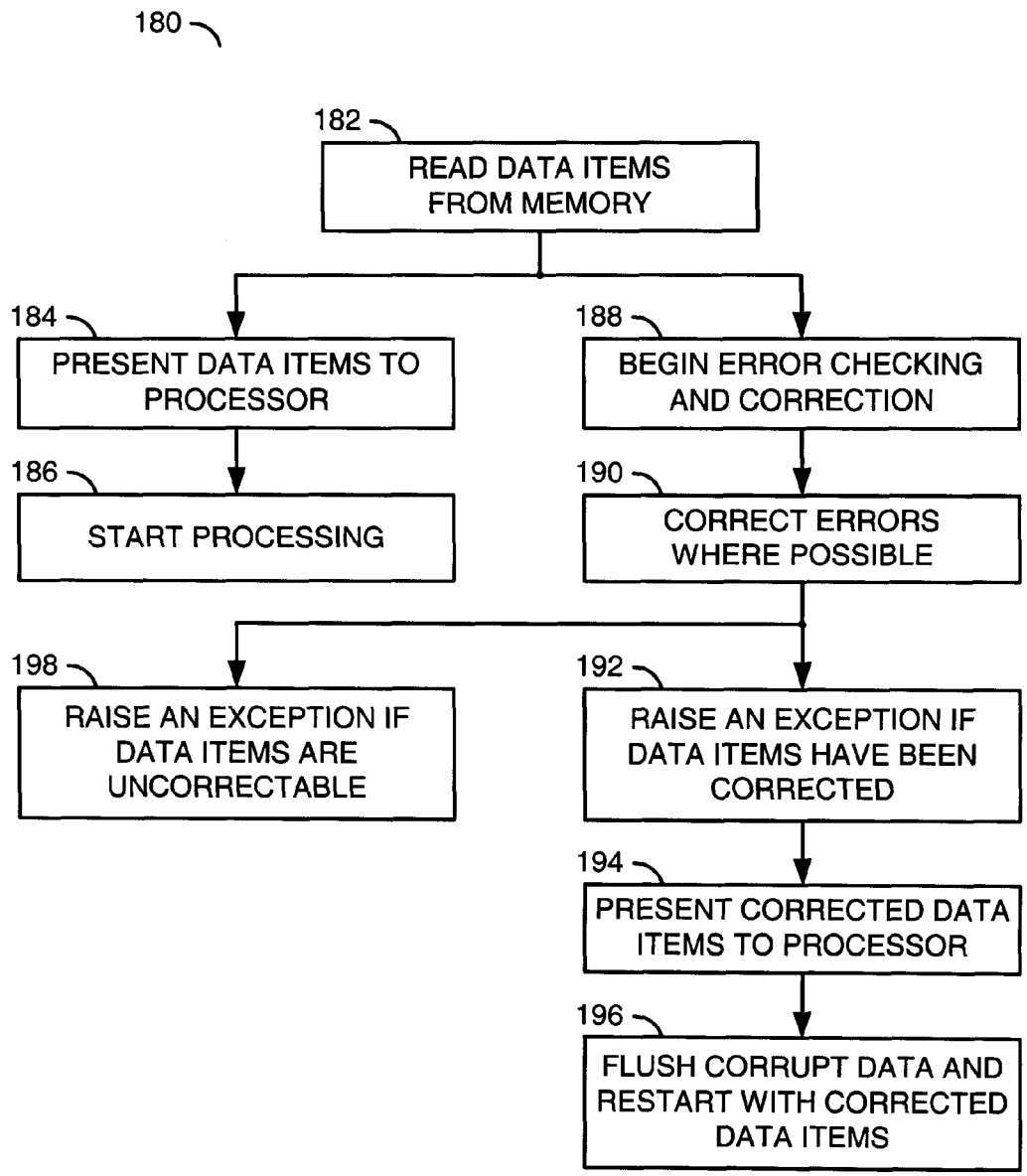
FIG. 7 is a flow diagram of an example implementation of a method to shorten correction delays.

Referring to FIG. 7, a flow diagram of an example implementation of a method 180 to shorten correction delays is shown. The method (or process) 180 generally comprises a step (or block) 182, a step (or block) 184, a step (or block) 186, a step (or block) 188, a step (or block) 190, a step (or block) 192, a step (or block) 194, a step (or block) 196 and a step (or block) 198. The method 180 may be implemented by the system 160.

In the step 182, data items may be read from the memory 142 into the apparatus 120'. The circuit 162 may receive the data items in the step 184 and subsequently begin processing in the step 186. The apparatus 120' may perform error detection and correction in the step 188. The step 188 may be performed in parallel (substantially simultaneously) with the steps 184 and 186.

In the step 190, the apparatus 120' may correct any correctable errors found in the data items read from the circuit 142. If correctable errors were detected, the apparatus 120' may raise a flag to the circuit 162 by asserting the corresponding signals ED12' and/or ED34' in the step 192. When ready, the corrected data items may be presented to the circuit 162 in the step 194. Thereafter, the circuit 162 may flush the corrupted data from a current task and restart the current task with the corrected data items in the step 196.

If the apparatus 120' detects uncorrectable errors in the data items received from the circuit 142, the apparatus 120' may raise a flag to the circuit 162 by asserting the corresponding signals ME12' and/or ME34' in the step 198. The asserted signals ME12' or ME34' generally indicates that the circuit 142 received corrupt data items in the step 184. In some embodiments, the signals ED12' and/or ED34' may also be asserted in the step 198. Proceeding forward in the presence of the corrupted data may be implementation specific.

The functions performed by the diagrams of FIGS. 3-7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAS, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMS, EEPROMS, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. A method to write data with error checking and correction overlap ranges, comprising the steps of:
   (A) receiving plurality of input numbers in a plurality of input signals;

(B) generating a plurality of combined numbers by appending (i) a first of said input numbers with a second of said input numbers, (ii) said second input number with a third of said input numbers and (iii) said third input number with a fourth of said input numbers;

(C) generating a plurality of error correction codes by separately operating on each of combined numbers, wherein each of said error correction codes is configured to correct at least one error in a corresponding one of said combined numbers; and (D) storing said input numbers and said error correction codes in a memory.

2. The method according to claim 1, wherein said input numbers each cover a range of values.

3. The method according to claim 2, wherein said combined numbers each cover twice said range.

4. The method according to claim 1, wherein (i) said error correction codes have a first total number of error correcting bits, (ii) separately operating on each of said input numbers would generate a second total number of error correcting bits and (iii) said first total number is less than said second total number.

5. The method according to claim 1, wherein said error correction codes have a total number of error correcting bits comprising one of (i) 18 total bits where each of said input numbers comprises 8 bits, (ii) 21 total bits where each of said input numbers comprises 16 bits, (iii) 24 total bits where each of said input numbers comprises 32 bits, (iv) 27 total bits where each of said input numbers comprises 64 bits and (v) 30 total bits where each of said input numbers comprises 128 bits.

6. The method according to claim 1, further comprising the steps of:

reading said input numbers and said error correction codes from said memory;

generating a second of a plurality of appended numbers by appending said second input number with said third input number;

generating a plurality of intermediate numbers by operating on said second appended number using a second of said error correction codes, wherein said second error correction code is configured to correct at least one error in said second appended number;

generate a first and a third of said appended numbers by appending (i) said first input number with a first of said intermediate numbers and (ii) said fourth input number with a second of said intermediate numbers respectively;

generating a plurality of output numbers by separately operating on each of said first and said third appended numbers using a first and a third of said error correction codes respectively, wherein said first and said third error correction codes are each configured to correct at least one error in a corresponding one of said appended numbers; and generating a plurality of output signals carrying said output numbers.

7. An apparatus comprising:

a first circuit configure to (i) receive a plurality of input numbers in a plurality of input signals, (ii) generate a plurality of combined numbers by appending (a) a first of said input numbers with a second of said input numbers, (b) said second input number with a third of said input numbers and (c) said third input number with a fourth of said input numbers and (iii) generate a plurality of error correction codes by separately operating on each of said combined numbers, wherein each of said error correction codes is configured to correct at least one error in a corresponding one of said combined numbers; and a memory configure to store said input numbers and said error correction codes.

8. The apparatus according to claim 7, wherein (i) said error correction codes have a first total number of error correcting bits, (ii) separately operating on each of said input numbers would generate a second total number of error correcting bits and (iii) said first total number is less than said second total number.

9. The apparatus according to claim 7, wherein said first circuit comprises:

a first module configured to generate a first of said error correction codes in response to said first input number appended to said second input number;

a second module configured to generate a second of said error correction codes in response to said second input number appended to said third input number; and a third module configured to generate a third of said error correction codes in response to said third input number appended to said fourth input number.

10. The apparatus according to claim 7, further comprising a second circuit configured to (i) read said input numbers and said error correction codes from said memory, (ii) generate a second of a plurality of appended numbers by appending said second input number to said third input number, (iii) generate a plurality of intermediate numbers by operating on said second appended number using a second of said error correction codes, wherein said second error correction code is configured to correct at least one error in said second appended number, (iv) generate a first and third of said appended numbers in a mode by appending (a) said first input number with a first of said intermediate values and (b) said fourth input number with a second of said intermediate values respectively, (v) generate a plurality of output numbers by separately operating on each of said first and said third appended numbers using a first and a third of said error correction codes respectively, wherein said first and said third error correction codes are each configured to correct at least one error in a corresponding one of said appended numbers, and (vi) generate a plurality of output signals carrying said output numbers.

11. A method to correct a plurality of input numbers with error checking and correction overlap ranges, comprising the steps of:

(A) reading said input numbers and a plurality of error correction codes from a memory;

(B) generating a second of a plurality of appended numbers by appending a second of said input numbers with a third of said input numbers;

(C) generating a plurality of intermediate numbers by operating on said second appended number using a second of said error correction codes, wherein said second error correction code is configured to correct at least one error in said second appended number; (D) generating a first and a third of said appended numbers in a mode by appending (i) a first of said input numbers with a first of said intermediate number and (ii) a fourth of said input numbers with a second of said intermediate numbers respectively;

(E) generating a plurality of output numbers by separately operating on each of said first and said third appended numbers using a first and a third of said error correction codes respectively, wherein said first and said third error correction codes are each configured to correct at least one error in a corresponding one of said appended numbers; and (F) generating a plurality of output signals carrying said output numbers.

12. The method according to claim 11, wherein (i) said error correction codes have a first total number of error correcting bits, (ii) separately operating on each of said input numbers would consume a second total number of error correcting bits and (iii) said first total number is less than said second total number.

13. The method according to claim 11, wherein each of said first and said third appended numbers in another mode are respective combinations of (i) said first and said second input numbers and (ii) said third and said fourth input numbers.

14. The method according to claim 13, further comprising the step of:

generating a mode signal indicating (i) said mode where said second appended numbers has no uncorrectable errors and (ii) said other mode where said second appended number has at least one of said uncorrectable errors.

15. The method according to claim 11, further comprising the steps of:

generating said output signals carrying said input numbers prior to generating said intermediate numbers; and asserting an exception signal in response to at least one error being detected among said input numbers.

16. An apparatus comprising:

a memory configured to store a plurality of input numbers and a plurality of error correction codes; and a first circuit configured to (i) read said input numbers and said error correction codes from said memory, (ii) generate a second of a plurality of appended numbers by appending a second of said input numbers with a third of said input numbers, (iii) generate a plurality of intermediate numbers by operating on said second appended number using a second of said error correction codes, wherein said second error correction code is configured to correct at least one error in said second appended number (iv) generate a first and a third of said appended numbers in a mode by appending (a) a first of said input numbers with a first of said intermediate number and (b) a fourth of said input numbers with a second of said intermediate numbers respectively, (v) generate a plurality of output numbers by separately operating on each of said first and said third appended numbers using a first and a third of said error correction codes respectively, wherein said first and said third error correction codes are each configured to correct at least one error in a corresponding one of said appended numbers, and (vi) generate a plurality of output signals carrying said output numbers.

17. The apparatus according to claim 16, wherein said first circuit comprises:

a first module configured to generate (i) a first of said output numbers corresponding to said first input number and (ii) a second of said output numbers corresponding to said second input number;

a second module configured to generate said intermediate numbers; and a third module configured to generate (i) a third of said output numbers corresponding to said third input number and (ii) a fourth of said output numbers corresponding to said fourth input number.

18. The apparatus according to claim 17, wherein said second module is further configured to generate a mode signal indicating (i) said mode where said second appended number has no uncorrectable errors and (ii) another mode where said second appended number has at least one of said uncorrectable errors.

19. The apparatus according to claim 16, wherein said first circuit is further configured to (i) generate said output signals carrying said input numbers prior to generating said intermediate numbers and (ii) assert an exception signal in response to at least one error being detected among said input numbers.

20. The apparatus according to claim 16, further comprising a second circuit configured to (i) receive said input numbers in a plurality of input signals, (ii) generate a plurality of combined numbers by appending (a) said first input number with said second input number, (b) said second input number with said third input number and (c) said third input number with said fourth input number and (iii) generate said error correction codes by separately operating on each of said combined numbers, wherein each of said error correction codes is configured to correct at least one error in a corresponding one of said combined numbers.

* * * * *